United States Patent [19]

Carobolante

[11] Patent Number: 5,223,772
[45] Date of Patent: Jun. 29, 1993

[54] METHOD AND APPARATUS FOR PROVIDING THE LOCK OF A PHASE-LOCKED LOOP SYSTEM FROM FREQUENCY SWEEP

[75] Inventor: Francesco Carobolante, Phoenix, Ariz.

[73] Assignee: SGS-Thomson Microelectronics, Inc., Carrollton, Tex.

[21] Appl. No.: 843,581

[22] Filed: Feb. 28, 1992

[51] Int. Cl.$^5$ ............................................. H02P 7/00
[52] U.S. Cl. .................................... 318/254; 318/138; 388/911
[58] Field of Search ............... 318/138, 254, 439, 599, 318/668, 268, 778, 779, 799, 811; 388/809, 812, 811, 813, 820, 800, 825, 906, 911, 915, 928.1

[56] References Cited

U.S. PATENT DOCUMENTS

| | | | |
|---|---|---|---|
| 4,272,712 | 6/1981 | Beling et al. | 318/696 |
| 4,599,545 | 7/1986 | Moriki et al. | 318/599 X |
| 4,689,540 | 8/1987 | Tani et al. | 318/608 |
| 4,739,230 | 4/1988 | Sonobe et al. | 388/812 |
| 4,743,815 | 5/1988 | Gee et al. | 318/254 |
| 4,879,498 | 11/1989 | Shinohara et al. | 318/254 |
| 4,928,043 | 5/1990 | Plunkett | 318/254 |
| 4,970,445 | 11/1990 | Kimura et al. | 318/254 |
| 4,983,894 | 1/1991 | Oku et al. | 318/138 |
| 5,034,668 | 7/1991 | Bausch | 318/254 |

*Primary Examiner*—Jonathan Wysocki
*Attorney, Agent, or Firm*—Richard A. Bachand; Lisa K. Jorgenson; Richard K. Robinson

[57] ABSTRACT

Synchronization of the output of an internally-driven VCO to an exterior clock signal is obtained by using the exterior clock signal to re-start the VCO at every exterior clock pulse, until the pre-set VCO frequency is reached. At that point, the restarting of the VCO ceases, and the VCO locks onto the internal signal it is designed to track. One application of this circuit is for enabling a smooth transition between open-loop, ramp-up of a polyphase DC motor to closed loop operation. Implementation of the circuit described phase-synchronizes the output of a phase-switching PLL loop, which is tracking the back emf of the motor, to the external clock used for motor ramp-up, so that there is no "jolt" in the motor at the transition from open-loop to closed-loop operation of the motor.

10 Claims, 2 Drawing Sheets

METHOD AND APPARATUS FOR PROVIDING THE LOCK OF A PHASE-LOCKED LOOP SYSTEM FROM FREQUENCY SWEEP

BACKGROUND OF THE INVENTION

1. Field of the Invention

This invention relates to improvements in methods for providing a smooth transition from open-loop step-up of a system frequency to closed-loop phase-locked loop (PLL) control by synchronization of the voltage-controlled oscillator (VCO) when the open-loop frequency is within pull-in range, and to circuits for accomplishing the same.

2. Description of the Prior Art

Although the present invention pertains to voltage controlled oscillator (VCO) synchronization of phase-locked loop (PLL) systems in general, it finds particular application in conjunction with polyphase DC motors, particularly of the brushless, sensorless, three-phase type used for rotating data media, such as are found in computer-related applications, such as hard disc drives, CD ROM drives, floppy disc drives, and the like. In such computer applications, three-phase, brushless, sensorless DC motors are becoming more popular, due to their reliability, low weight, and accuracy.

Brushless DC motors are commonly driven by a speed-controller that utilizes two functional loops: an overall speed-control loop, typically a PLL circuit, and a phase switching loop. A typical prior art motor speed-controller 10 is shown in FIG. 1. The outer speed control loop 13 has a phase comparator 11 that compares a reference frequency, $F_{REF}$, applied to an input line 14 with a signal developed by a signal processor 20 from the stator windings of a motor 19. The phase difference signal developed by the phase comparator 11 is filtered by a filter 12 to drive switch logic circuitry 15, which in turn drives the motor 19 via appropriate drive circuitry 16. The outer speed control loop 13 ensures that the desired motor speed, set by the reference frequency, $F_{REF}$, on a line 14, is maintained. The phase switching inner loop 17 generates a timing signal that is sent to the switch logic circuit 15 to time the commutations in the stator coils 21 that drive the motor 19. In order to properly time the commutations in the circuit 19, however, the exact position of the rotor 18 must be determined. In the past, sensors, such as Hall or optical sensors, have been used to determine the position of the rotor. A more recent approach uses back emf information derived from selected ones of the stator coils 21 of the motor 19 to determine the location of the rotor 18. In such approach, as the magnetic rotor 18 passes a "floating" stator coil, it acts as a generator in regard to the coil and impresses an electromotive force or "back emf" on the coil. The back emf signal is processed and routed to the switching logic system to obtain the correct phase-switching. The back emf detection information not only enables the position of the rotor 18 to be determined, but the speed of the motor 21, as well. This motor speed information is fed back to the phase-comparator 11 of the outer speed-control loop 13 to maintain the desired motor operating speed.

The inner phase-switching loop 17 can be implemented in several ways. As mentioned, the clock signal for phase-switching in the inner loop may be provided by filtering the back emf of the motor 19 and extracting timing information with a signal processor 20. This involves determining the "zero-crossing" of the back emf, and using delays to control the timing of the switching.

A more sophisticated approach shown in FIG. 2 is similar to that of U.S. Pat. No. 4,928,043, and uses a phase-locked loop (PLL) 35 to phase-track the back emf, in place of the signal processor 20. The phase-locked loop 35 includes a filter 32 connected to receive a signal derived from the back emf generated by the rotor 18 of the motor 19, to produce an output to a phase comparator 34. The phase comparator 34 compares the back emf signal with a desired phase signal (not shown) and produces an output to a second filter 36 to provide an error voltage to a voltage controlled oscillator (VCO) 38. In this approach, the back emf is used as an input to the PLL 35, and the output of the PLL 35 is fed to the phase-switching logic circuitry 15. In this way, the phase-switching logic circuitry 15 is synchronized to the back emf. This configuration offers better performance, since it reduces "phase-jitter", rapid, uncontrolled rotor movements due to imprecisely-timed phase-switching. The drawback of this approach is that at low motor speeds that occur when the motor 19 is first starting, the back emf signal is not of sufficient magnitude to drive the loop. In addition, as with any PLL loop, "lock" can be established in only a limited range of frequencies, and therefore during most of the start-up phase, the switching frequency is outside (lower than) the "lock"range. Thus, the motor 19 is generally ramped-up to speed open-loop, with the timing signal to the switching logic being provided by an external clock. The desired final operating state is a closed-loop mode in which the clock to the phase-switching is provided by a voltage-controlled oscillator (VCO) 38. What is needed is a way to produce a transition from open-loop operation to closed-loop operation without significant error in the switching timing that makes the loop incapable of locking and which may consequently stall the motor.

SUMMARY OF THE INVENTION

It is, therefore, an object of the invention to provide an improved circuit and method to provide a smooth transition from open-loop step-up of a system frequency to closed-loop PLL operation by synchronization of a VCO to the open-loop frequency when that frequency is within pull-in range.

It is another object of the invention to provide an improved apparatus and method of the type described to be used for starting DC motors, particularly of the brushless, sensorless type that are used for rotating data media, such as are found in computer-related applications, including hard disc drives, CD ROM drives, floppy disc drives, and the like.

It is still another object of the invention to provide an improved apparatus and method of the type described that enables a smooth transition from open-loop motor operation to closed-loop operation without a significant error in the sequence of the switching timing that would make the loop incapable of locking and would stall the motor.

These and other objects, features and advantages of the invention will be apparent to those skilled in the art from the following detailed description of the invention, when read in conjunction with the accompanying drawings and appended claims.

In accordance with a broad aspect of the invention, a circuit is presented for starting a polyphase motor. The circuit includes circuitry for initially applying clock pulses of successively decreasing periods to the motor on startup, and a phase-locked loop including a voltage controlled oscillator having an input connected to re-initiate an output of the voltage controlled oscillator in response to the clock pulses of the source of clock pulses during startup. Means are provided for operating the voltage controlled oscillator to produce an output having a fixed period during startup, and a period comparator compares the period of the clock pulses to the period of the output of the voltage controlled oscillator. Circuitry is provided for switching the output of the voltage controlled oscillator to drive the motor when the period of the clock pulses equals the period of the output of the voltage controlled oscillator. In a preferred embodiment, the entire circuit is implemented as a single integrated-circuit device.

In accordance with another broad aspect of the invention, a circuit is provided for switching the output of a phase-locked loop to provide drive signals to an external load when clock signal of successively decreasing periods reach a predetermined period. The circuit includes an oscillator for generating a signal of initial fixed frequency. A period comparator compares a period of the signal of initial fixed frequency to a period of the clock signal, and the clock signal is connected to continually reset the oscillator until the period comparator indicates that the period of the signal of initial fixed frequency exceeds the period of the clock signal. A first switch circuit switches from the clock signal to said oscillator output as the drive signals when the period comparator indicates that the period of the signal of fixed initial frequency exceeds the period of the clock signal. In one embodiment, a circuit generates a feedback signal having a phase indicating a condition of the external load; for example, the external load can be a polyphase dc motor, and the circuit for generating a feedback signal can be a circuit for generating a signal related to the back emf induced in a floating coil of said motor. In such case, the phase-locked loop can include a phase comparator to compare a phase of the feedback signal with a load condition related signal and a second switch circuit can be provided for switching an output of said phase comparator to control the frequency of said oscillator when said period comparator indicates that the period of said signal of initial fixed frequency exceeds the period of said clock signal.

In accordance with yet another broad aspect of the invention, a method of synchronizing a phase-locked loop to external pulses of successively decreasing period is presented. In accordance to the method, a VCO of the phase-locked loop is operated to generate a plurality of pulses having a reference period. The pulses of the VCO are synchronized to the external pulses until the period of the external pulses are less than the reference period, and when the period of the external pulses becomes equal to the reference period, the phase-locked loop is switched to control the VCO.

The external pulses are directed to an output to drive a load until the period of the external pulses becomes equal to the reference period, and thereafter the output of the VCO of the phase-locked loop is provided. In addition, a status signal is generated in response to a condition of the load, and a phase difference is determined between the status signal and the VCO. The phase-locked loop is then operated in accordance with the phase difference. The status signal can be generated from a signal from a back emf of a floating coil of a polyphase motor that indicates the position of a rotor of the motor, and the signal from a back emf of a floating coil can be used as an input to the phase-locked loop.

BRIEF DESCRIPTION OF THE DRAWINGS

The invention is illustrated in the accompanying drawings, in which.

In the various figures of the drawing, like reference numerals are used to denote like or similar parts.

DETAILED DESCRIPTION OF THE PREFERRED EMBODIMENT

The invention has many applications, particularly in motor controllers where the initial ramp-up of the motor speed is obtained in an open-loop configuration but the final speed of the motor is controlled by a PLL circuit. As noted previously motor-controllers of the prior art include the general idea of using an overall speed-control loop and an inner phase-switching loop. The prior art also includes the use of filtered back emf as a basis for phase-switching in the inner loop and the use of a PLL in the inner-loop to synchronize the switching clock to the back emf signal. The inner phase-switching loop is the part of the system wherein the subject invention is implemented.

Figure 1:
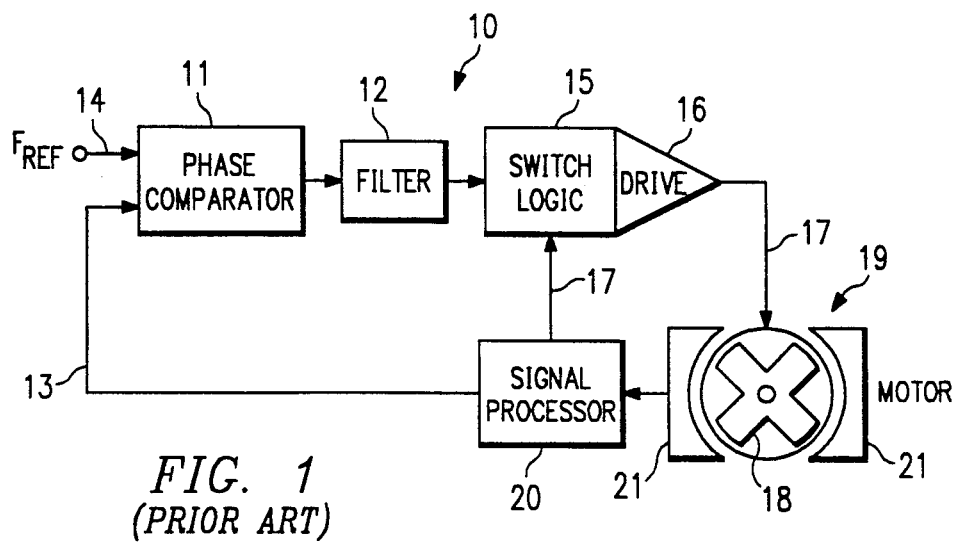
FIG. 1 is an electrical block diagram of a typical prior art motor speed control system, incorporating an outer motor speed-control loop and an inner phase-switching loop.
Figure 2:
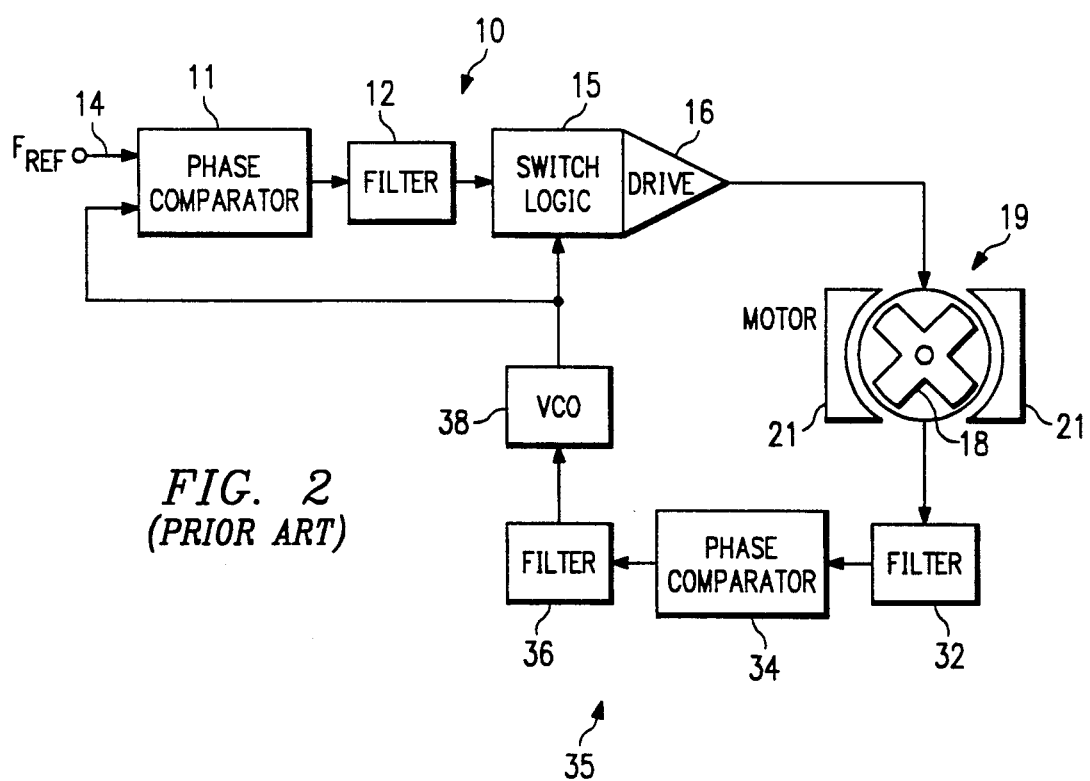
FIG. 2 is an electrical block diagram of a typical prior art motor speed control system, incorporating an outer motor speed-control loop and an inner loop for phase-switching that utilizes a PLL circuit.
Figure 3:
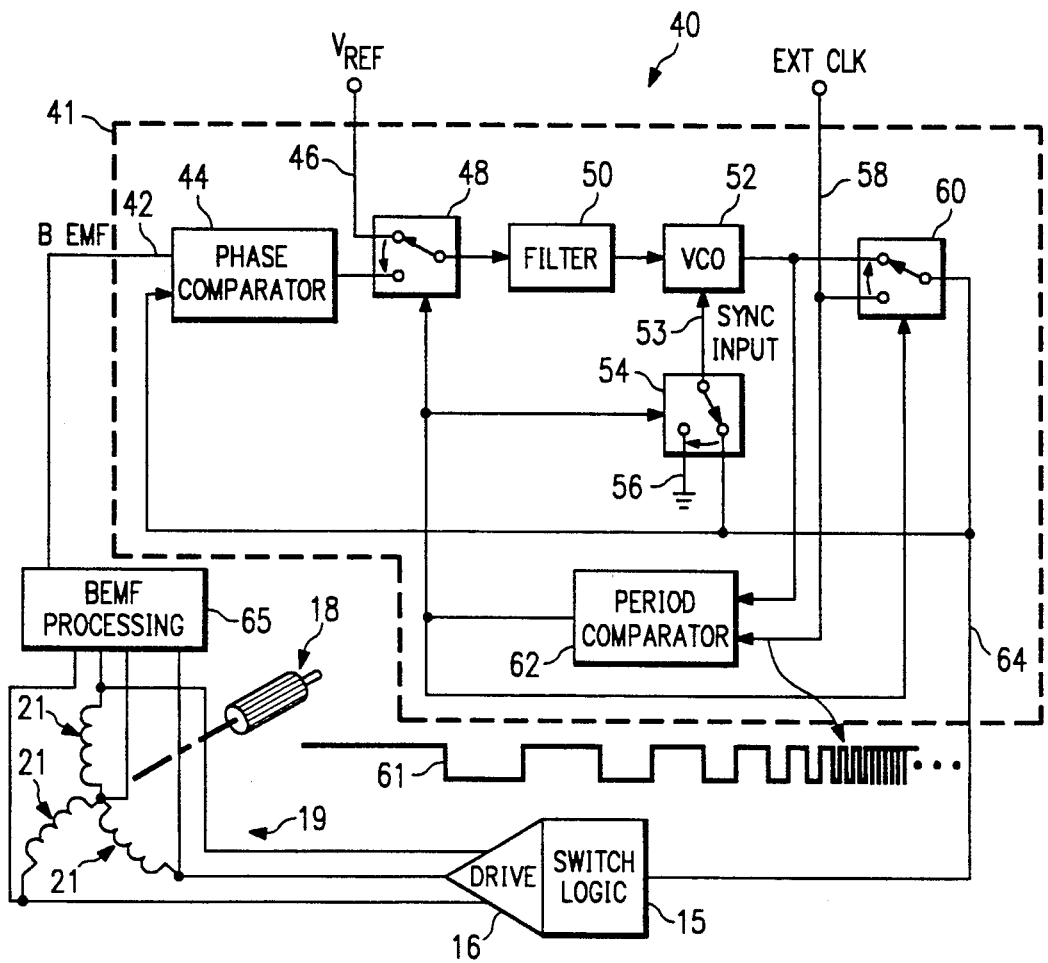
FIG. 3 is an electrical block diagram of an inner loop for phase-switching in a motor driving system incorporating a motor starter system incorporating a VCO synchronization system in accordance with a preferred embodiment of the invention. The arrow notations in the switches indicate the change from open-loop mode to closed-loop mode.

In contrast to the prior art, schematic block diagram of an inner phase-switching loop 40 in which the apparatus and method in accordance with a preferred embodiment of the invention may be incorporated is shown in FIG. 3. Although the switching loop 40 can be constructed of discrete components, preferably the circuit is integrated onto a single semiconductor chip (denoted by the dotted line 41) adapted for connection into an overall motor-starting and speed-control system.

As noted before, this system achieves a smooth transition between the open-loop motor-starting phase and closed-loop control. When the system is started, the open-loop phase begins during which the motor switching clock 64 is supplied by an external clock, EXT CLK, on a line 58 via a switch 60. The EXT CLK signal 61 on the line 58 begins at zero frequency and is gradually increased in a linear fashion to not quickly escape the capture-range of the VCO 52 before it can be locked-onto. This slow ramp-up is also necessary because motors have a limited capability for acceleration. Also, at the beginning, the reference voltage ($V_{REF}$) applied to a line 46 is placed on the input to the voltage-controlled oscillator (VCO) 52. $V_{REF}$ is the voltage necessary to set the output of the VCO 52 at the "switch over" frequency preselected by the user to be within the pull-in range of the PLL system. By way of example, the switches 47, 54, and 60 discussed above may be realized by any number of devices including mechanical switching devices and multiplexers implemented on integrated-circuit devices. Similarly, the VCO 52 may be realized by any number of devices, including properly set-up 555-timer integrated-circuits or any of several different analog implementations.

The filter 50 is preferably a proportional integral filter, in order to minimize phase error. Since an integrating filter is used, the integrating capacitor must be maintained discharged so as to know exactly the output voltage. Such a clamping may be effected within the filter itself.

As mentioned previously, the VCO 52 is part of the PLL system 40 and will provide the motor switching clock signal on the line 64 after the switch over point is reached. During the open-loop startup phase of operation, the switch 54 assists in synchronizing the VCO 52 to the EXT CLK signal on the line 58 by routing the EXT CLK signal pulses via line 53 to the SYNC input of the VCO 52 to cause the output of the VCO 52 to restart on each pulse of the EXT CLK signal. The restarting of the VCO 52, for example, can be achieved in a manner similar to the reset function provided on a standard 555 timer chip, and serves to synchronize the output of the VCO 52 with the EXT CLK signal, enabling smooth transition on switch over after startup as described below.

The EXT CLK signal also goes to the switch logic via the switch 60 and to the period comparator 62 so that its period may be compared to the period of the VCO 52 output that was set at the switch over frequency. When the EXT CLK signal to the motor 19 reaches a lower period (i.e., higher frequency) than the VCO 52 output frequency, the switch over will occur. At that point the period comparator 62 will trigger the switch over to closed-loop mode by signaling switch 54 to switch the synchronizing input of the VCO 52 from the EXT CLK signal to a reference potential 56, typically ground, by signaling the switch 48 to switch the input of the VCO 52 from $V_{REF}$ on line 46 to the output of the phase comparator 44, and by switching the output of the phase-switching loop 40 (i.e., input to the switching logic) from the EXT CLK signal to the output of the VCO 52. By switching the SYNC input from the EXT CLK signal to the reference potential, the synchronizing of the VCO 52 to the EXT CLK signal is halted, to enable the VCO 52 to run at the desired final speed. In closed-loop operation, the back 42 emf signal produced by bemf processing 65 onto the line 42 from the motor 19 is compared with the output of the VCO 52 by the phase comparator 44. This speeds up the output of the VCO 52 when a phase difference occurs between the back emf on the line 42 and the VCO 52 output. In this fashion, the PLL loop produces a motor switching clock signal on the line 64 that tracks the back emf signal on the line 42.

Thus, a smooth transition to closed-loop operation is achieved. This phase-switching circuit 40 minimizes "jolt" in the motor 19 because the frequency and phase of the VCO 52 is synchronized to the exterior clock signal on line 58. This is important because if the first pulse from the VCO 52 after the switch over is out of phase or is not frequency synchronized with the preceding EXT CLK pulse then the lock on the motor 19 will be lost.

Thus, demanding phase and frequency requirements are placed on this type of circuit. In other applications, if the VCO is inserted with a phase error, the loop will adjust with time. However, in a motor application if the lock is missed the motor 19 must be slowed down to zero speed and restarted. It will be appreciated that acquiring lock-on may be difficult if a phase error is introduced due to motor inertia and erroneous torque generation. It is therefore desirable to get a correct phase-lock-on the first time, as achieved by the phase-switching circuit 40.

Figure 4:
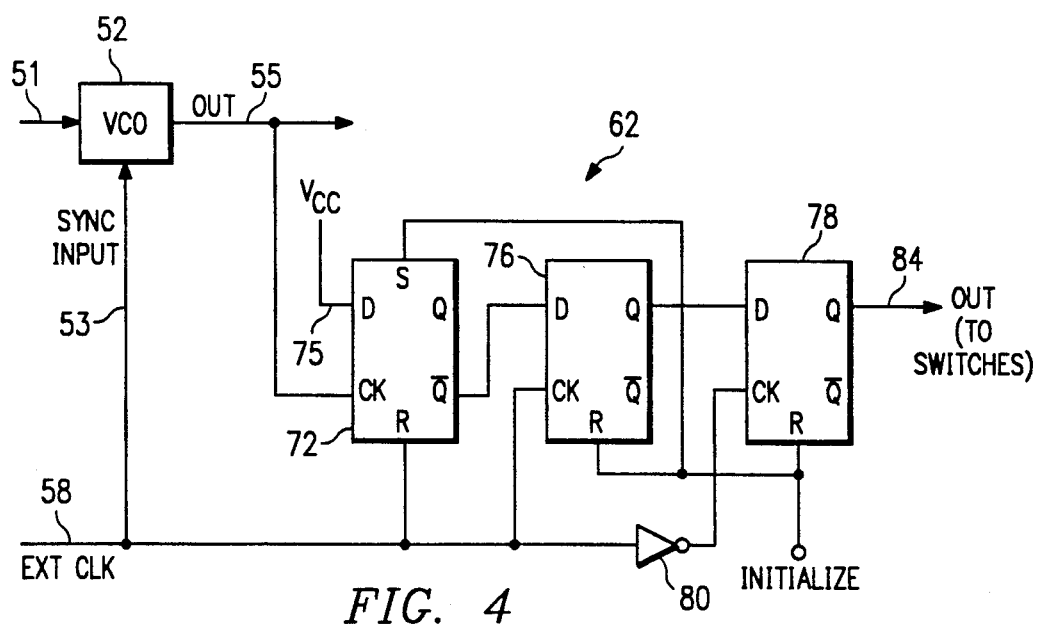
FIG. 4 is an electrical schematic diagram of a preferred embodiment of the period comparator shown in FIG. 3.

The period comparator 62 may be implemented by any number of "off the shelf" devices, including integrated-circuits that have been specially designed for comparing the period of various signals and that are widely available for such applications. FIG. 4 is a block diagram of one particular embodiment of the period comparator 62 that is shown in FIG. 3. This device utilizes three D-type flip-flops 72, 76, and 78, and waits for two consecutive positive edges of pulses from the EXT CLK 58 to occur before a second positive edge of a VCO 52 pulse occurs to determine whether the frequency of the EXT CL signal has exceeded the VCO 52 output frequency on a line 55. Since the VCO 52 will initially be oscillating faster than the EXT CLK signal the first pulse the period comparator 62 will receive will be from the VCO 52.

Referring to FIG. 4, the output from the VCO 52 will clock the first D flip-flop 72, causing a low state at its Q(bar) output. When a positive edge of an EXT CLK pulse occurs, it resets the first flip-flop 72 while simultaneously clocking the second flip-flop 76. Due to the propagation delay of the first flip-flop 72, the low state that was present at its Q(bar) output will be clocked into the D input of the second flip-flop 76 before the reset of the first flip-flop 72 occurs. Therefore, this low state will be clocked through the second flip-flop 76. Soon thereafter, the Q(bar) output of the first flip-flop 72 changes to a high state, since it was reset. If another positive edge of an EXT CLK pulse occurs before a positive edge of a pulse from the VCO 52 occurs, then the Q(bar) output of the first flip-flop 72 remains high because of the reset. This second EXT CLK pulse will clock a high state to the Q output of the second flip-flop 76. The falling edge of the EXT CLK pulse, inverted by the invertor 80, will clock the high state from the Q output of the second flip-flop 76 through the third flip-flop 78 to its Q output regardless of the state of the VCO output 55.

Thus, the circuit 62 looks for two positive pulse edges from the EXT CLK signal before the completion of a VCO 52 cycle (i.e., two adjacent positive pulse edges), and when this occurs signals the switches 48, 54, and 60 in the circuit 40 to change states as indicated by the arrows in FIG. 3. It will be appreciated that the third flip-flop 78 is not strictly necessary to the determination of when the frequency of the EXT CLK signal exceeds the output frequency of said VCO 52 since the desired output was generated on the Q output of the second flip-flop 76 upon receipt of the second rising edge of the EXT CLK signal. In many implementations the phase-switching circuitry 40 will work without the third flip-flop 78, but in the implementation illustrated, the switch over signal is delayed by the length of the EXT CLK pulse signal to give a slower analog VCO 52 time to begin operation.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

I claim:

1. A circuit for producing a drive signal for starting and operating a polyphase motor having a back emf in a floating coil, comprising:
   a source providing an initial reference voltage;
   a source of clock pulses of successively decreasing periods;
   a voltage controlled oscillator having an input for receiving an input voltage and having a VCO output, said voltage controlled oscillator having a resynchronizing input for reinitiating said VCO output on each clock pulse of said source of clock pulses;
   a period comparator for comparing the period of said clock pulses to the period of said VCO output;
   a phase comparator for comparing the phases of the back emf and said VCO output;
   first, second, and third switches controlled by said period comparator;
   said first switch for switching the input of said voltage controlled oscillator from said initial reference voltage to said output of the phase comparator when the period of said clock pulses becomes less than the period of said VCO output;
   said second switch for switching from said clock pulses to said VCO output to provide said drive signal when the period of said clock pulses becomes less than the period of said VCO output; and
   said third switch for disabling said resynchronizing input from said clock pulses when the period of said clock signal becomes less than the period of said VCO output.

2. The circuit of claim 1 wherein said period comparator comprises flip-flop circuits to compare a positive edge of a pulse from said voltage controlled oscillator with a positive edge of said clock pulses.

3. The circuit of claim 2 wherein said flip-flop circuits operate to switch said first, second, and third switches when two positive edges of the clock pulses occur before a second positive edge from said voltage controlled oscillator occurs.

4. The circuit of claim 3 wherein said flip-flop circuits are D-type flip-flops circuits.

5. The circuit of claim 1 wherein said period comparator comprises:
   a first D-type flip-flop having a D input, a clock, a SET control, a RESET control, a Q output, and a Q(bar) output, wherein the D input has a reference potential impressed on it, the clock is connected to the output frequency of the voltage controlled oscillator, the SET control input is connected to an initializing control line, and the RESET control is connected to said source of clock pulses;
   a second D-type flip-flop having a D input, a clock, a RESET control, a Q output, and a Q(bar) output, wherein the D input is connected to the Q(bar) output of the first D-type flip-flop, the clock is connected to said source of clock pulses, and the RESET control is connected to said initializing control line;
   a third D-type flip-flop having a D input, a clock, a RESET control, a Q output, and a Q(bar) output, wherein the D input is connected to the Q output of the second D-type flip-flop, the RESET is connected to the initializing control line, and the Q output is connected to said first, second, and third switches; and
   an invertor having an input connected to the source of clock pulses and an output connected to the clock of said third D-type flip-flop.

6. The circuit of claim 1 wherein said switches are multiplexers.

7. The circuit of claim 1 wherein said switches are integrated-circuit devices.

8. The circuit of claim 1 further comprising a filter connected to an input of said voltage controlled oscillator for reducing noise and circuit overshoot.

9. The circuit of claim 8 wherein the filter is a proportional integral filter.

10. The circuit of claim 1 wherein the entire circuit is implemented on a single integrated circuit device.

* * * * *